United States Patent
Turner et al.

(10) Patent No.: US 8,831,234 B2
(45) Date of Patent: Sep. 9, 2014

(54) AUDIO JACK DETECTION AND CONFIGURATION

(75) Inventors: John R. Turner, Portland, ME (US); Seth M. Prentice, Auburn, ME (US); Oscar Freitas, Cape Elizabeth, ME (US); Wonsoo Moon, Seoul (KR)

(73) Assignee: Fairchild Semiconductor Corporation, San Jose, CA (US)

(\*) Notice: Subject to any disclaimer, the term of this patent is extended or adjusted under 35 U.S.C. 154(b) by 323 days.

(21) Appl. No.: 13/188,778

(22) Filed: Jul. 22, 2011

(65) Prior Publication Data

US 2012/0019309 A1 Jan. 26, 2012

Related U.S. Application Data

(60) Provisional application No. 61/367,266, filed on Jul. 23, 2010.

(51) Int. Cl.
   *H04R 29/00* (2006.01)
   *H04B 3/00* (2006.01)
   *H03K 5/1254* (2006.01)

(52) U.S. Cl.
   CPC ................................ *H03K 5/1254* (2013.01)
   USPC ................... 381/58; 381/81; 700/94; 710/15

(58) Field of Classification Search
   CPC .................................. H04R 29/00; H04B 3/00
   USPC .............. 381/58, 77, 74, 123, 81, 85; 700/94; 710/15
   See application file for complete search history.

(56) References Cited

U.S. PATENT DOCUMENTS

| | | |
|---|---|---|
| 5,754,552 A | 5/1998 | Allmond et al. |
| 6,301,344 B1 | 10/2001 | Meyer et al. |
| 6,650,635 B1 | 11/2003 | Weinstein et al. |
| 7,053,598 B2 | 5/2006 | Shieh et al. |
| 7,565,458 B2 | 7/2009 | Thijssen et al. |
| 7,869,608 B2 | 1/2011 | Sander et al. |
| 7,916,875 B2 | 3/2011 | Kanji |
| 8,064,613 B1 | 11/2011 | Helfrich |
| 8,150,046 B2 * | 4/2012 | Hansson et al. ............ 381/58 |

(Continued)

FOREIGN PATENT DOCUMENTS

| | | |
|---|---|---|
| CN | 1441353 A | 9/2003 |
| CN | 1708023 A | 12/2005 |

(Continued)

OTHER PUBLICATIONS

"Korean Application Serial No. 10-2011-0073717, Amendment Filed Aug. 19, 2011", 4 pgs.

(Continued)

*Primary Examiner* — Disler Paul
(74) *Attorney, Agent, or Firm* — Schwegman, Lundberg & Woessner, P.A.

(57) ABSTRACT

This document discusses, among other things, an audio jack detection circuit configured to be coupled to an audio jack receptacle of an external device. The audio jack detection circuit configured to receive to receive audio jack receptacle information, to disable an oscillator when the audio jack receptacle information indicates that the audio jack receptacle is empty, and to enable the oscillator when the audio jack receptacle information indicates that the audio jack receptacle includes an audio jack.

27 Claims, 8 Drawing Sheets

(56) References Cited

U.S. PATENT DOCUMENTS

| | | | |
|---|---|---|---|
| 8,155,337 B2* | 4/2012 | Choi et al. | 381/74 |
| 8,193,834 B2 | 6/2012 | Maher et al. | |
| 8,230,126 B2 | 7/2012 | Siulinski | |
| 8,244,927 B2* | 8/2012 | Chadbourne et al. | 710/15 |
| 8,467,828 B2 | 6/2013 | Johnson et al. | |
| 8,489,782 B2* | 7/2013 | Chadbourne et al. | 710/15 |
| 2005/0201568 A1 | 9/2005 | Goyal | |
| 2006/0147059 A1 | 7/2006 | Tang | |
| 2007/0133828 A1 | 6/2007 | Kanji | |
| 2008/0112572 A1 | 5/2008 | Wong et al. | |
| 2008/0140902 A1 | 6/2008 | Townsend et al. | |
| 2008/0150512 A1 | 6/2008 | Kawano | |
| 2008/0247241 A1 | 10/2008 | Nguyen et al. | |
| 2008/0298607 A1* | 12/2008 | Wu et al. | 381/111 |
| 2008/0318629 A1 | 12/2008 | Inha et al. | |
| 2009/0136058 A1 | 5/2009 | Choi et al. | |
| 2009/0180630 A1 | 7/2009 | Sander et al. | |
| 2009/0198841 A1 | 8/2009 | Yoshida et al. | |
| 2009/0285415 A1 | 11/2009 | Wu | |
| 2010/0173676 A1 | 7/2010 | Zhou | |
| 2010/0199112 A1 | 8/2010 | Yokota et al. | |
| 2011/0085673 A1 | 4/2011 | Lee | |
| 2011/0099298 A1 | 4/2011 | Chadbourne et al. | |
| 2011/0099300 A1 | 4/2011 | Siulinski | |
| 2011/0199123 A1 | 8/2011 | Maher et al. | |
| 2012/0019306 A1 | 1/2012 | Turner et al. | |
| 2012/0057078 A1 | 3/2012 | Fincham et al. | |
| 2012/0198183 A1 | 8/2012 | Wetzel et al. | |
| 2012/0200172 A1 | 8/2012 | Johnson et al. | |
| 2012/0237051 A1 | 9/2012 | Lee | |
| 2012/0326736 A1 | 12/2012 | Chadbourne et al. | |
| 2013/0020882 A1 | 1/2013 | Prentice | |
| 2013/0021041 A1 | 1/2013 | Prentice | |
| 2013/0021046 A1 | 1/2013 | Prentice et al. | |
| 2013/0034242 A1 | 2/2013 | Prentice et al. | |
| 2014/0025845 A1 | 1/2014 | Chadbourne et al. | |

FOREIGN PATENT DOCUMENTS

| | | | |
|---|---|---|---|
| CN | 1728082 A | 2/2006 | |
| CN | 1859813 A | 11/2006 | |
| CN | 101069410 A | 11/2007 | |
| CN | 101425048 A | 5/2009 | |
| CN | 101426035 A | 5/2009 | |
| CN | 101453510 A | 6/2009 | |
| CN | 101489159 A | 7/2009 | |
| CN | 101729958 A | 6/2010 | |
| CN | 102045620 A | 5/2011 | |
| CN | 102193047 A | 9/2011 | |
| CN | 102378087 A | 3/2012 | |
| CN | 102892059 A | 1/2013 | |
| CN | 102892061 A | 1/2013 | |
| CN | 102892067 A | 1/2013 | |
| CN | 102892068 A | 1/2013 | |
| CN | 102193047 B | 5/2014 | |
| CN | 102378087 B | 6/2014 | |
| KR | 20110046361 A | 5/2011 | |
| KR | 1020120015265 A | 2/2012 | |
| KR | 1020130011988 A | 1/2013 | |
| KR | 1020130011989 A | 1/2013 | |
| KR | 1020130011990 A | 1/2013 | |
| KR | 1020130011991 A | 1/2013 | |
| TW | 201312873 A1 | 3/2013 | |
| TW | 201312874 A1 | 3/2013 | |
| TW | 201314674 A1 | 4/2013 | |
| TW | 201316704 A1 | 4/2013 | |

OTHER PUBLICATIONS

U.S. Appl. No. 12/606,562, Response filed Jan. 3, 2012 to Final Office Action mailed Oct. 28, 2011, 7 pgs.

U.S. Appl. No. 12/606,562, Response filed Sep. 13, 2011 to Non Final Office Action mailed Jun. 22, 2011, 9 pgs.

U.S. Appl. No. 12/606,562, Final Office Action mailed Oct. 28, 2011, 10 pgs.

U.S. Appl. No. 12/606,562, Non Final Office Action mailed Jun. 22, 2011, 9 pgs.

U.S. Appl. No. 12/606,562, Notice of Allowance Mailed Jan. 27, 2012, 7 pgs.

U.S. Appl. No. 12/606,562, Response to Rule 312 Communication mailed May 29, 2012, 1 pgs.

U.S. Appl. No. 12/606,562, Response to Rule 312 Communication mailed Jul. 2, 2012, 2 pgs.

U.S. Appl. No. 12/606,582, Final Office Action mailed Dec. 8, 2011, 10 pgs.

U.S. Appl. No. 12/606,582, Non Final Office Action mailed Jul. 14, 2011, 8 pgs.

U.S. Appl. No. 12/606,582, Notice of Allowance mailed Apr. 12, 2012, 8 pgs.

U.S. Appl. No. 12/606,582, Response filed Mar. 6, 2012 to Final Office Action mailed Dec. 8, 2011, 10 pgs.

U.S. Appl. No. 12/606,582, Response filed Sep. 28, 2011 to Non Final Office Action mailed Jul, 14, 2011, 10 pgs.

U.S. Appl. No. 12/705,183, Notice of Allowance mailed Feb. 9, 2012, 8 pgs.

U.S. Appl. No. 13/584,465 , Response filed Jan. 9, 2013 to Non Final Office Action mailed Nov. 15, 2012, 8 pgs.

U.S. Appl. No. 13/584,465, Non Final Office Action mailed Nov. 15, 2012, 8 pgs.

U.S. Appl. No. 13/584,465, Notice of Allowance mailed Mar. 18, 2013, 7 pgs.

"Autonomous Audio Headset Switch", Texas Instruments TS3A225E, [Online]. Retrieved from the Internet: <URL: http://www.ti.com/lit/ds/scds329/scds329.pdf>, (Nov. 2011), 11 pgs.

"Chinese Application Serial No. 201220044818.X, Notification to Make Rectification mailed Jul. 17, 2012", 3 pg.

"USB OTG Mechanical Presentation", [Online] Retrieved from the Internet on Jun. 3, 2011 http://www.usb.org/developers/onthego/london/OTG_mechanical.pdf, (Feb. 26, 2002), 27 pgs.

"USB Remote Cable", [Online]. Retrieved from the Internet: <URL: http://chdk.wikia.com/wiki/USB_Remote_Cable>, (Jun. 9, 2009), 4 pgs.

Mehta, Arpit, "Keep Power Consumption in Check with Low-Power Comparators that Autosense Plugged-In Accessories", [Online]. Retrieved from the Internet: <URL: http://www.maxim-ic.com/appnotes.cfm/an_pk/4327>, (Feb. 27, 2009), 6 pgs.

U.S. Appl. No. 13/188,834, Non Final Office Action mailed Sep. 24, 2013, 15 pgs.

U.S. Appl. No. 13/188,834, Response filed Jan. 24, 2014 to Non Final Office Action mailed Sep. 24, 2013, 12 pgs.

Chinese Application Serial No. 201010526298.1, Office Action mailed Sep. 4, 2013, 10 pgs.

Chinese Application Serial No. 201010526298.1, Response filed Jan. 14, 2014 to Office Action mailed Sep. 4, 2013, 16 pgs.

Chinese Application Serial No. 201110038132.X, Office Action mailed Aug. 9, 2013, 11 pgs.

Chinese Application Serial No. 201110038132.X, Response filed Dec. 23, 2013 to Office Action mailed Aug. 9, 2013, 8 pgs.

Chinese Application Serial No. 201110209512.5, Office Action mailed Sep. 4, 2013, 5 pgs.

Chinese Application Serial No. 201110209512.5, Response filed Jan. 20, 2014 to Office Action mailed Sep. 4, 2013, 49 pgs.

U.S. Appl. No. 13/188,834, Final Office Action mailed Feb. 21, 2014, 11 pgs.

U.S. Appl. No. 13/188,834, Notice of Allowance mailed Apr. 28, 2014, 10 pgs.

U.S. Appl. No. 13/188,834, Response filed Apr. 21, 2014 to Final Office Action mailed Feb. 21, 2014, 8 pgs.

U.S. Appl. No. 13/189,480, Non Final Office Action mailed Mar. 14, 2014, 14 pgs.

U.S. Appl. No. 13/941,889, Non Final Office Action mailed Apr. 24, 2014, 7 pgs.

Chinese Application Serial No. 201010526298.1, Office Action mailed Apr. 3, 2014, w/English Translation, 11 pgs.

(56) References Cited

OTHER PUBLICATIONS

Chinese Application Serial No. 201110209513.X, Office Action mailed Feb. 8, 2014, w/English Translation, 9 pgs.

U.S. Appl. No. 13/189,480, Response filed Jun. 16, 2014 to Non Final Office Action mailed Mar. 14, 2014, 10 pgs.

Chinese Application Serial No. 201210257009.1, Office Action mailed Jun. 17, 2014, 8 pgs.

Chinese Application Serial No. 201210257100.3, Office Action mailed Jun. 19, 2014, 8 pgs.

* cited by examiner

AUDIO JACK DETECTION AND CONFIGURATION

CLAIM OF PRIORITY

This application claims the benefit of priority under 35 U.S.C. §119(e) of John R. Turner et al. U.S. Provisional Patent Application Ser. No. 61/367,266, entitled "AUDIO JACK DETECTION AND CONFIGURATION," filed on Jul. 23, 2010, which is incorporated by reference herein in its entirety.

BACKGROUND

Many mobile devices, such as mobile phones or other portable electronics, include audio jacks and are configured to distinguish between a variety of external audio jack accessories using the baseband processor of the mobile device. However, using the baseband processor to distinguish between external audio jack accessories can utilize valuable general purpose input/output pins on the baseband processor, as well as memory and processor time. Further, because the baseband processor is responsible for many other important operations, distinguishing between external audio jack accessories using a separate detection circuit can improve the efficiency, both time and power, of detecting and identifying external devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
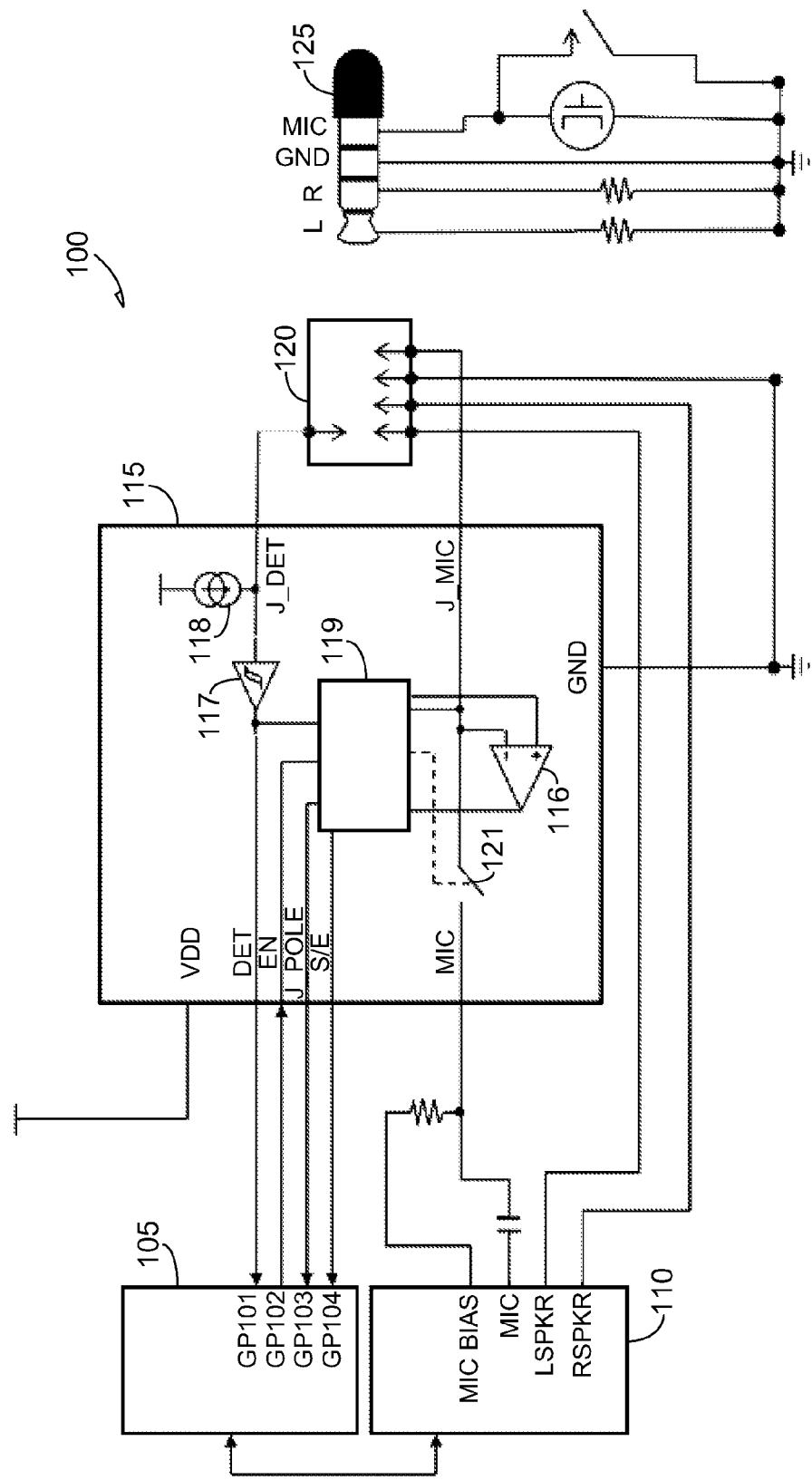
FIG. 1 illustrates generally an example of a system including an audio jack detection circuit.

In an example, a system can include a device, such as a cellular phone, a portable music player, or one or more other portable or other devices configured to receive an audio jack. The device can include a processor (e.g., a baseband processor, etc.) and an audio jack receptacle (e.g., a three-pole audio jack receptacle, a four-pole audio jack receptacle, or one or more other audio jack receptacles) configured to receive an audio jack (e.g., a three-pole audio jack, a four-pole audio jack, or one or more other audio jacks corresponding to the audio jack receptacle) coupled to an external device, such as a microphone, a speaker, a headset, or one or more other external devices. The audio jack receptacle can be configured to receive an input (e.g., a microphone input, send/end key detection, one or more other external input, etc.) from the external device, or to provide an output (e.g., a speaker output, an external device control, etc.) to the external device.

Solutions exist to determine whether an audio jack has three poles or four poles. However, in certain examples, a four-pole audio jack can initially appear as a three-pole audio jack, such as if the send/end key of the four-pole audio device is stuck or otherwise activated (e.g., depressed during startup). Many existing solutions carry the error through until the audio jack is re-coupled.

The present inventors have recognized, among other things, an audio jack detection circuit including a current source, digital logic, and an oscillator, the audio jack detection circuit configured to, among other things, perform one or more of the following:

1) detect that an audio jack has been coupled to or decoupled from the device (e.g., plugged into the audio jack receptacle, unplugged from the audio jack receptacle, etc.);
2) provide a low-power state, consuming a small amount of power when an audio jack is decoupled from the device (e.g., disabling the oscillator, etc.);
3) determine the type of audio jack coupled to the device (e.g., a three-pole audio jack, a four-pole audio jack, or one or more other type of audio jack);
4) determine if the audio jack includes a microphone connection;
5) switch in/out a microphone port between an audio codec and a headset microphone;
6) determine if the audio jack includes a send/end key connection;
7) detect that the send/end key has been pressed (e.g., detect that a microphone bias has been grounded, that a voltage has been applied, etc.);
8) check (e.g., an initial check, a periodic check, a continuous check, etc.) for a stuck or defective send/end switch, for example, if the coupled audio jack is a three-pole audio jack; or
9) provide audio jack information to the processor (e.g., information about whether an audio jack is plugged into the audio jack receptacle, the type of audio jack, information about a detected microphone connection, send/end key information, etc.).

In an example, the audio jack detection circuit can initially determine a detected audio jack as either a three-pole audio jack or a four-pole audio jack. If the initial determination is a three-pole audio jack, the audio jack detection circuit can regularly confirm that the audio jack is indeed a three-pole audio jack, and not a four-pole audio jack with a depressed or stuck send/end key. If the initial determination is a four-pole audio jack, the determination of the type of audio jack ceases until the audio jack is unplugged or the audio jack detection circuit is reset.

Generally, using the audio jack detection circuit can free pins and space at the processor (e.g., the baseband processor), and further provide more accurate, faster, and cheaper control of the determination between three-pole and four-pole audio jacks, for example, without reducing the efficiency or number of available pins of the processor or requiring the processor to control detection of the audio jack. Further, the audio jack detection circuit described herein can allow for control of both three-pole and four-pole audio jacks with a single component instead of, for example, separate sets of components, separate programs or software workarounds on the processor, or separate systems designed to work with each type of audio jack.

FIG. 1 illustrate generally an example of a system 100 including a baseband processor 105 having one or more general purpose input/output pins, an audio codec 110 coupled to the baseband processor 105, an audio jack detection circuit 115, an audio jack receptacle 120, and an audio jack 125.

In an example, the audio jack detection circuit 115 can include a comparator 116 configured to receive a microphone signal at a headset microphone pin (J_MIC), a buffer 117 (e.g., a comparator, a Schmitt trigger, etc.) configured to receive an audio jack detection signal at an audio jack detection pin (J_DET), a current source 118 (e.g., a 0.5 µA current source, etc.), and an oscillator and logic 119. In an example, the audio jack receptacle 120 can include a normally open (NO) configuration, in certain examples, operating as a normally open switch.

In an example, the current source 118 can be configured to provide a voltage at the buffer 117 when the audio jack receptacle 120 is empty that can be pulled to ground when an audio jack 125 is inserted into the audio jack receptacle 120. In an example, the buffer 117 can be configured to provide a detection signal to the oscillator and logic 119 and the processor 105. The detection signal can include a logic high signal when the audio jack receptacle 120 is empty and a logic low signal when the audio jack receptacle 120 includes the audio jack 125.

In another example, the normally open configuration of the audio jack receptacle 120 and the current source 118 (e.g., a 0.5 µA current source, etc.) of the audio jack detection circuit 115 can be replaced with an audio jack receptacle 120 having a normally closed (NC) configuration and a current sink (e.g., a 0.5 µA current sink, etc.). In other examples, one or more other example components or systems can be used. In other examples, the audio jack detection circuit 115 can use one or more other components to detect the audio jack 125 and to provide an indication of the detected audio jack to the processor 105.

In an example, the audio jack 125 can include a plurality of poles (e.g., two, three, four, etc.). A three-pole audio jack (e.g., a standard audio or stereo headphone jack) can include a left audio connection (L), a right audio connection (R), and ground (GND). In certain examples, though, the three-pole audio jack can include four separate contacts with more than one contact being ground (e.g., a left audio connection, a right audio connection, and two ground connections). The audio jack 125 illustrated in FIG. 1 includes a four-pole audio jack. The four-pole audio jack (e.g., a headset with a microphone or one or more other inputs or outputs) can include a left audio connection (L), a right audio connection (R), ground (GND), and a microphone connection (MIC) or other input or output connection. In certain examples, the four-pole audio jack can include a send/end key, using the microphone connection as a send/end key connection. In an example, on the four-pole audio jack, if the send/end key is activated, the microphone connection can be pulled to ground, appearing similar to a three-pole audio jack while the send/end key is activated.

The audio jack detection circuit 115 can include a low-power state, consuming a small amount of power (e.g., a majority from the current source 118) when the audio jack receptacle 120 is empty, in certain examples, disabling the oscillator to reduce power usage by the oscillator and logic 119. In an example, when the audio jack detection signal indicates that the audio jack receptacle 120 has received the audio jack 125, the oscillator can be enabled and the audio detection circuit 115 can determine the type of the audio jack 125 coupled to the audio jack receptacle 120 (e.g., either a three-pole audio jack or a four-pole audio jack) using the comparator 116, the oscillator and logic 119, and the microphone signal from the audio jack receptacle 120.

In an example, the oscillator and logic 119 can be configured to provide a determination of a pressed send/end to the processor 105 using a send/end key pin (S/E), to provide a determination of a three or four-pole audio jack to the processor 105 using an audio jack determination pin (J_POLE), and to receive an enable signal from the processor 105 using an enable pin (EN).

In an example, if the audio jack detection circuit 115 initially determines the audio jack 125 as a three-pole audio jack, then the audio jack detection circuit 115 can be configured to continuously confirm that the audio jack 125 is a three-pole audio jack, and not, for example, a four-pole audio jack with a depressed send/end key (e.g., a stuck send/end key, a send/end key depressed during initialization or startup, etc.), grounding the microphone connection, making the four-pole audio jack appear as a three-pole audio jack. If the audio jack detection circuit 115 initially determines the audio jack 125 as a four-pole audio jack, then the audio jack detection circuit can be configured to monitor for a send/end key activation on the microphone connection of the four-pole audio jack. In an example, once the audio jack is detected as a four-pole audio jack, it cannot be changed to a three-pole audio jack until power-down or reset.

In an example, the audio jack detection circuit 115 can include a switch 121 configured to open the connection between a microphone bias and the microphone connection of the audio jack 125 to reduce leakage current on a microphone path when send/end key detection is not required. In an example, the oscillator and logic 119 can receive the detection signal and the microphone signal, determine the type of audio jack 125 coupled to the audio jack receptacle 120, and provide an indication of the audio jack type and, in certain examples, an indication of a depressed send/end key, to the processor 105. In an example, the oscillator and logic 119 can include digital logic (e.g., in silicon) configured to determine the type of audio jack 125 or the depressed send/end key. In an example, when the oscillator is disabled, the digital logic can consume a very small amount of power.

Stuck Key Error Detection and Correction

In an example, the audio jack detection circuit 115 can be configured to determine and, in certain examples, constantly validate the number of poles on the audio jack 125 and provide that information to a processor 105. In an example, the audio jack detection circuit 115 can continuously validate a three-pole audio jack, checking that the three-pole audio jack is not a four-pole audio jack with a stuck send/end key or a send/end key depressed during startup. If the stuck send/end key later becomes unstuck, the audio jack detection circuit 115 can correct the pole status. In certain examples, the audio jack detection circuit 115 can be configured to automatically detect a three-pole audio jack without using software or the processor 105. In other examples, other audio jacks or receptacles can be used with more or less than the three- or four-pole audio jacks disclosed herein.

Figure 2:
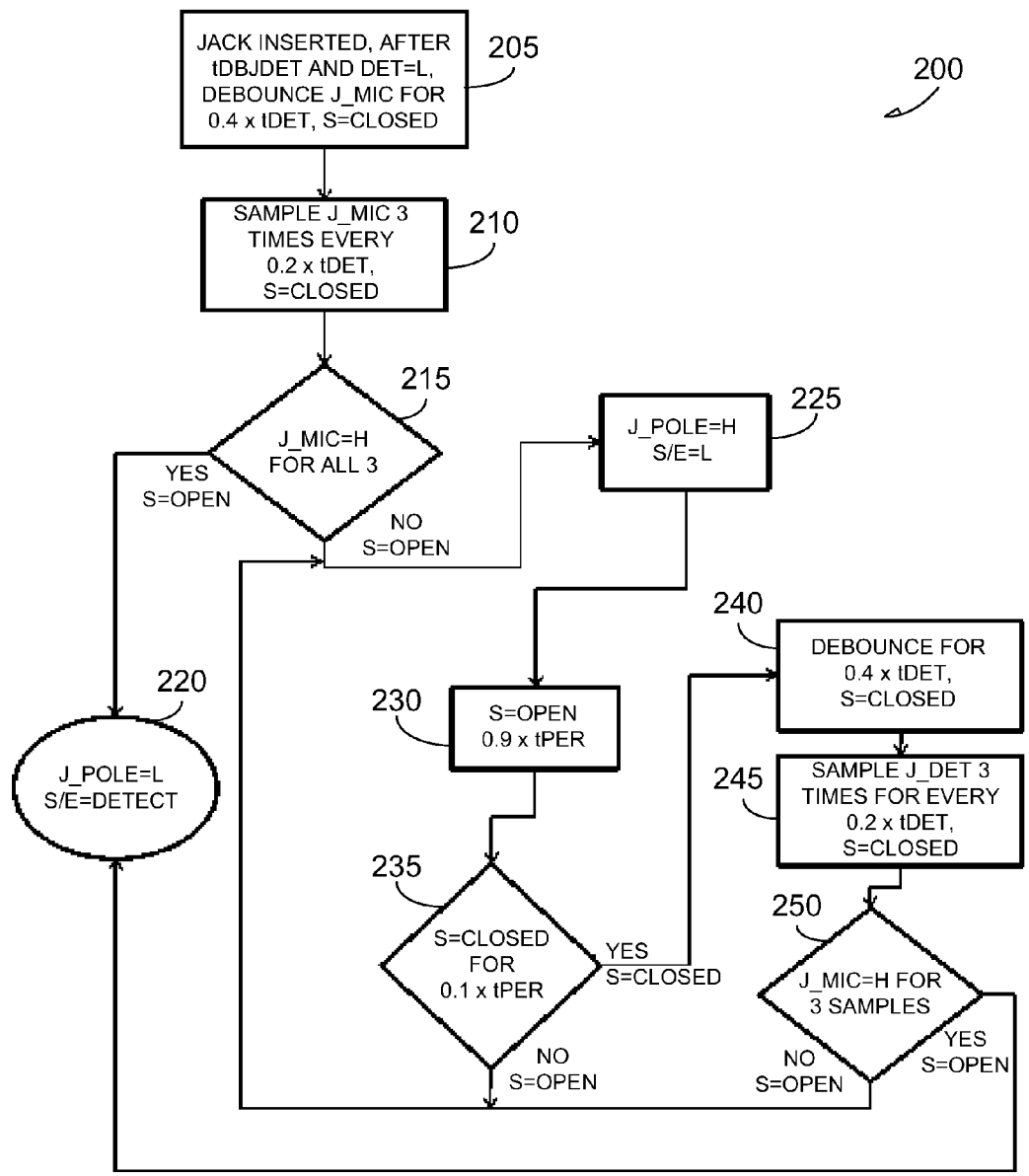
FIG. 2 illustrates generally an example of a method including detecting a three-pole audio jack, and double-checking for a four-pole audio jack.

FIG. 2 illustrates generally an example of a method 200 including detecting a three-pole audio jack and double-checking for a four-pole audio jack. In the example of FIG. 2, the following acronyms are used: "tDBJDET," the audio jack detection debounce time; "DET," a pin to provide an indication of a detected audio plug (e.g., active low); "S," an internal switch (e.g., the switch 121); "J_MIC," a headset microphone pin; "tDET," the debounce and sample time for pole position; "J_POLE," a pin to provide determination of a three-pole (e.g., high) or four-pole (e.g., low); "S/E," a pin to provide determination of a pressed send/end key (e.g., high); and "tPER," an internal switch closing and opening periods for microphone or send/end key detection.

At 205, when an audio jack is inserted into an audio jack receptacle and the audio jack detection pin has been debounced for a period of time (e.g., tDBJDET, etc.), the detection signal (e.g., the output of the buffer 117, etc.) can change from a logic high signal to a logic low signal, indicating a valid audio jack detection signal. Once the valid audio jack detection signal is received, the microphone signal can be debounced for a time period (e.g., 0.4×tDET, etc.) and the internal switch can be closed.

At 210, the headset microphone pin can be sampled one or more times, and the value of the one or more samples can be loaded into a register. In an example, the headset microphone pin can be sampled more than once and, in certain examples, at regular intervals. For example, the headset microphone pin can be sampled three times at regular intervals (e.g., 0.2× tDET each, etc.), and the values of the three samples can be loaded into the register. In an example, after loading the one or more samples into the register, the internal switch can be opened.

Figure 3:
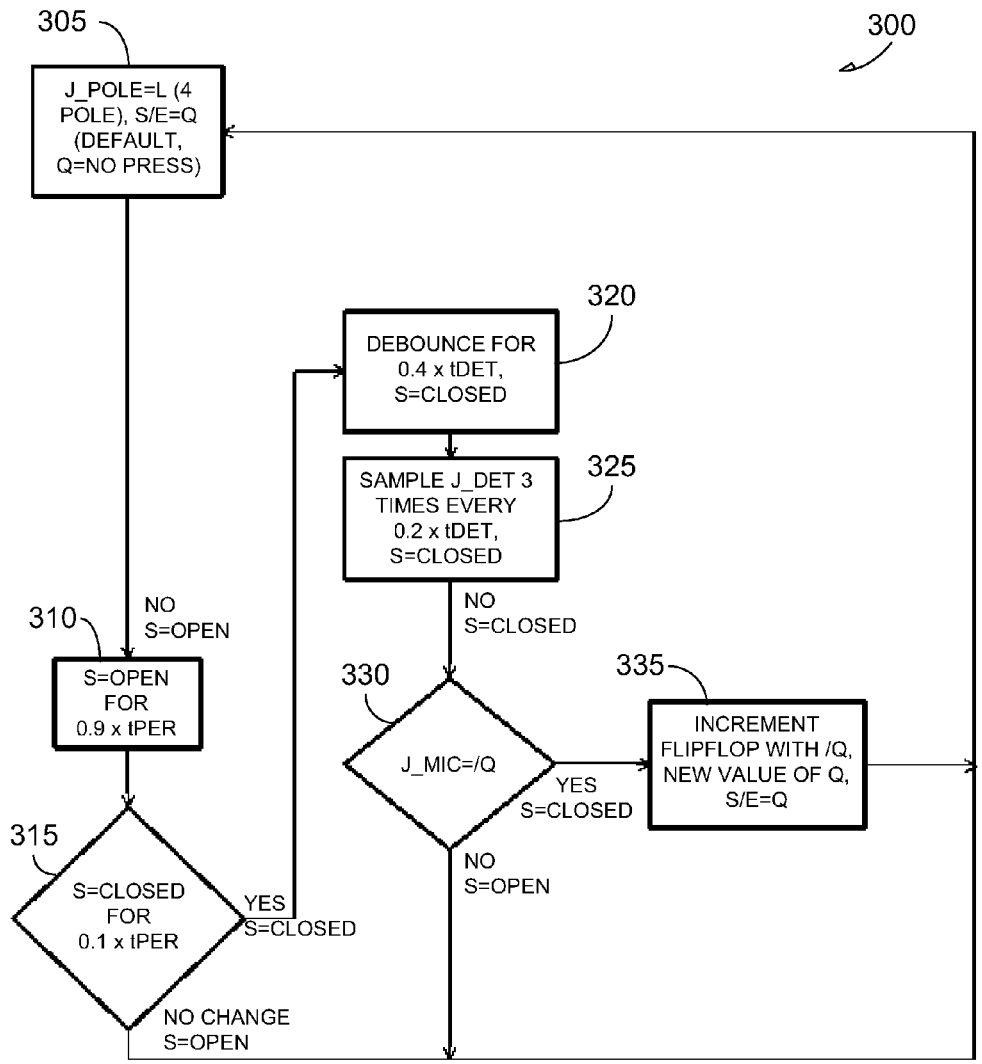
FIG. 3 illustrates generally an example of a method including detecting a send/end key activation on a four-pole audio jack.

At 215, if each of the one or more samples in the register indicates that the headset microphone pin is not grounded (e.g., J_MIC=high, where "high" is 0.2V, etc.), then at 220, the audio jack detection circuit can indicate to the processor that a four-pole audio jack is coupled to the audio jack receptacle (e.g., J_POLE=low, etc.) and send/end key selection can be monitored, such as illustrated in the example of FIG. 3. In an example, at 220, once the determination of a four-pole audio jack has been made, the audio jack detection circuit may not test for three or four-pole audio jack until the audio jack is removed and plugged back in, or until the audio jack detection circuit is reset.

At 215, if one or more of the samples in the register indicates that the headset microphone pin is grounded (e.g., one or more of the samples indicates that J_MIC=low, etc.), then at 225, the audio jack detection circuit can indicate to the processor that a three-pole audio jack is coupled to the audio jack receptacle.

At 230, the internal switch can remain open for a period of time (e.g., 0.9×tPER, etc.), reducing leakage current on the microphone path when the headset microphone pin is not being sampled, saving power.

At 235, the internal switch can be closed for a period of time (e.g., 0.1×tPER, etc.), generally a fraction of the open time of step 230 (e.g., to increase power savings), and a change in the headset microphone pin can be monitored. If no change is detected, then, at 225, the audio jack detection circuit can indicate to the processor that a three-pole audio jack is coupled to the audio jack receptacle and the internal switch can be opened. If a change is detected, then, at 240, the microphone signal can be debounced for a time period (e.g., 0.4×tDET, etc.) and the internal switch can remain closed.

At 245, the headset microphone pin can be sampled one or more times, and the value of the one or more samples can be loaded into a register. In an example, after loading the one or more samples into the register, the internal switch can be opened.

At 250, if each of the one or more samples in the register indicates that the headset microphone pin is not grounded (e.g., J_MIC=high, where "high" is 0.2V, etc.), then at 220, the audio jack detection circuit can indicate to the processor that a four-pole audio jack is coupled to the audio jack receptacle (e.g., J_POLE=low, etc.) and send/end key selection can be monitored.

At 250, if one or more of the samples in the register indicates that the headset microphone pin is grounded (e.g., one or more of the samples indicates that J_MIC=low, etc.), then at 225, the audio jack detection circuit can indicate to the processor that a three-pole audio jack is coupled to the audio jack receptacle.

Send/End Detection

In an example, in a four-pole audio jack having a microphone connection, there typically exists a current leakage path through the microphone (e.g., can be greater than 500 µA when the microphone is plugged in). To reduce leakage current on the microphone path, the audio jack detection circuit 115 can include an internal switch (e.g., the switch 221) configured to close and check for send/end key activation only a portion of the total "on" time (e.g., 10%, etc.), thus saving power due to microphone leakage (e.g., using a 10% "on" time, the power savings is 100%−10%=90%). Further, the switch 221 can be configured to reduce or eliminate any clicking associated with plugging in the microphone due to said leakage.

FIG. 3 illustrates generally an example of a method including detecting a send/end key activation on a four-pole audio jack. In the example of FIG. 2, the following acronyms are used: "S," an internal switch (e.g., the switch 121); "J_MIC," a headset microphone pin; "tDET," the debounce and sample time for pole position; "J_POLE," a pin to provide determination of a three-pole (e.g., high) or four-pole (e.g., low); "S/E," a pin to provide determination of a pressed send/end key (e.g., high); "tPER," an internal switch closing and opening periods for microphone or send/end key detection; "Q," a variable representing the state of the send/end key; and "/Q," the inverse of the variable Q, representing a change in the state of the send/end key.

At 305, the audio jack detection circuit can indicate to the processor that a four-pole audio jack is coupled to the audio jack receptacle (e.g., J_POLE=low, etc.) and send/end pin can be set at a default variable "Q," indicating initially that the send/end key is not pressed.

At 310, the internal switch be opened, or can remain open, for a period of time (e.g., 0.9×tPER, etc.), reducing leakage current on the microphone path when the headset microphone pin is not being sampled, saving power.

At 315, the internal switch can be closed for a period of time (e.g., 0.1×tPER, etc.), and a change in the headset microphone pin can be monitored. If no change is detected, the process flow returns to step 305. If a change is detected, then, at 320, the microphone signal can be debounced for a time period (e.g., 0.4×tDET, etc.) and the internal switch can remain closed.

At 325, the headset microphone pin can be sampled one or more times, and the value of the one or more samples can be loaded into a register. In an example, after loading the one or more samples into the register, the internal switch can be opened.

At 330, if each of the one or more samples in the register indicates that the value of the headset microphone pin has not changed, the process flow returns to step 305.

At 330, if one or more of the samples in the register indicates that the value of the headset microphone pin has changed, then, at 335, the value of the send/end pin can toggle, indicating a change in the send/end key state, and the variable "Q" can be updated to indicate that the send/end key is pressed.

In an example, updating the variable "Q" can allow a single detection algorithm to detect a change in state of the send/end key (e.g., pressed to not pressed, not pressed to pressed, etc.).

Example State Diagrams

FIGS. 4-8 illustrate generally examples of various state diagrams. In certain examples, one or more of the state diagrams of FIGS. 4-8 can be used in combination, or separately.

Generally, the processing taking place using logic (e.g., in silicon) can replace processing that could have previously been done with software. In the examples of FIGS. 4-8, power on reset (POR) can reset all digital logic. In certain examples, there can be a first number of oscillator clock cycles (e.g., 10, etc.) between switch enabled and comparing the headset microphone pin using the comparator, and a second number of oscillator clock cycles (e.g., 4, etc.) between determining that an audio jack is plugged in (e.g., DET=low) and switch enabled. In various examples, once the audio jack has been determined as a four-pole audio jack (e.g., J_POLE=low) there is no way back to a determination of a three-pole audio jack (e.g., J_POLE=high) except through disconnect or reset. Further, there are three conditions to change the state of the chip from the outside point of view: 3 samples; all samples equal the same value; and each samples represent opposite state of current pin(s).

Figure 4:
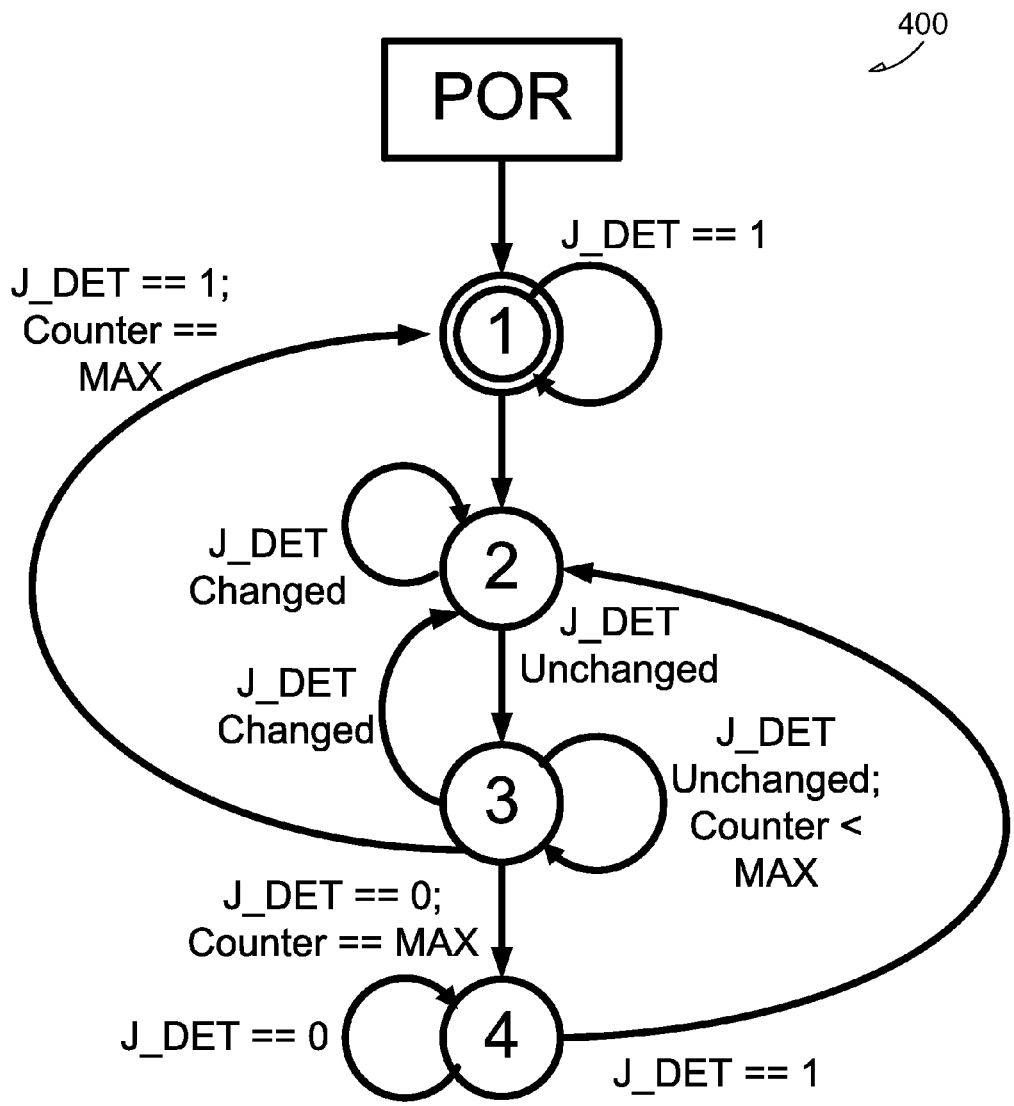
FIGS. 4-8 illustrate generally examples of various state diagrams.

FIG. 4 illustrates generally an example of an audio jack detection pin (J_DET) state diagram 400. Generally, when an audio jack is plugged into or otherwise coupled to an audio jack receptacle, the audio jack detection pin has a low value (e.g., J_DET=low), and when the audio jack receptacle is empty, the audio jack detection pin has a high value (e.g., J_DET=high).

In State 1, a state machine reset can be asserted. The state machine can remain in State 1 while the audio jack receptacle is empty. The oscillator can be disabled in State 1 to save power. When an audio jack is plugged into the audio jack receptacle, the state machine can proceed to State 2.

In State 2, the oscillator can be enabled, and an audio jack detection counter can be set to 0 (e.g., J_DET COUNTER-0). If the value of the audio jack detection pin changes, the state machine can remain in State 2. If the value of the audio jack detection pin does not change, the state machine can proceed to State 3.

In State 3, the audio jack detection counter can be incremented. If the value of the audio jack detection pin changes, the state machine can return to State 2. If the value of the audio jack detection pin does not change, the state machine can remain in State 3 and the audio jack detection counter can be incremented. If the value of the audio jack detection pin changes and the audio jack detection counter reaches a maximum value (e.g., 3, 10, etc.), the state machine can return to State 1. If the value of the audio jack detection pin does not change and the audio jack detection pin counter reaches the maximum value, the state machine can proceed to State 4.

In State 4, the state machine reset can be de-asserted, and a detection signal can be provided to the processor indicating that the audio jack receptacle includes a valid audio jack. If the value of the audio jack detection pin does not change (e.g., if the value of the audio jack detection pin indicates that the audio jack is plugged into the audio jack receptacle), the state machine remains in State 4. If the value of the audio jack detection pin changes, the state machine can return to State 2.

Figure 5:
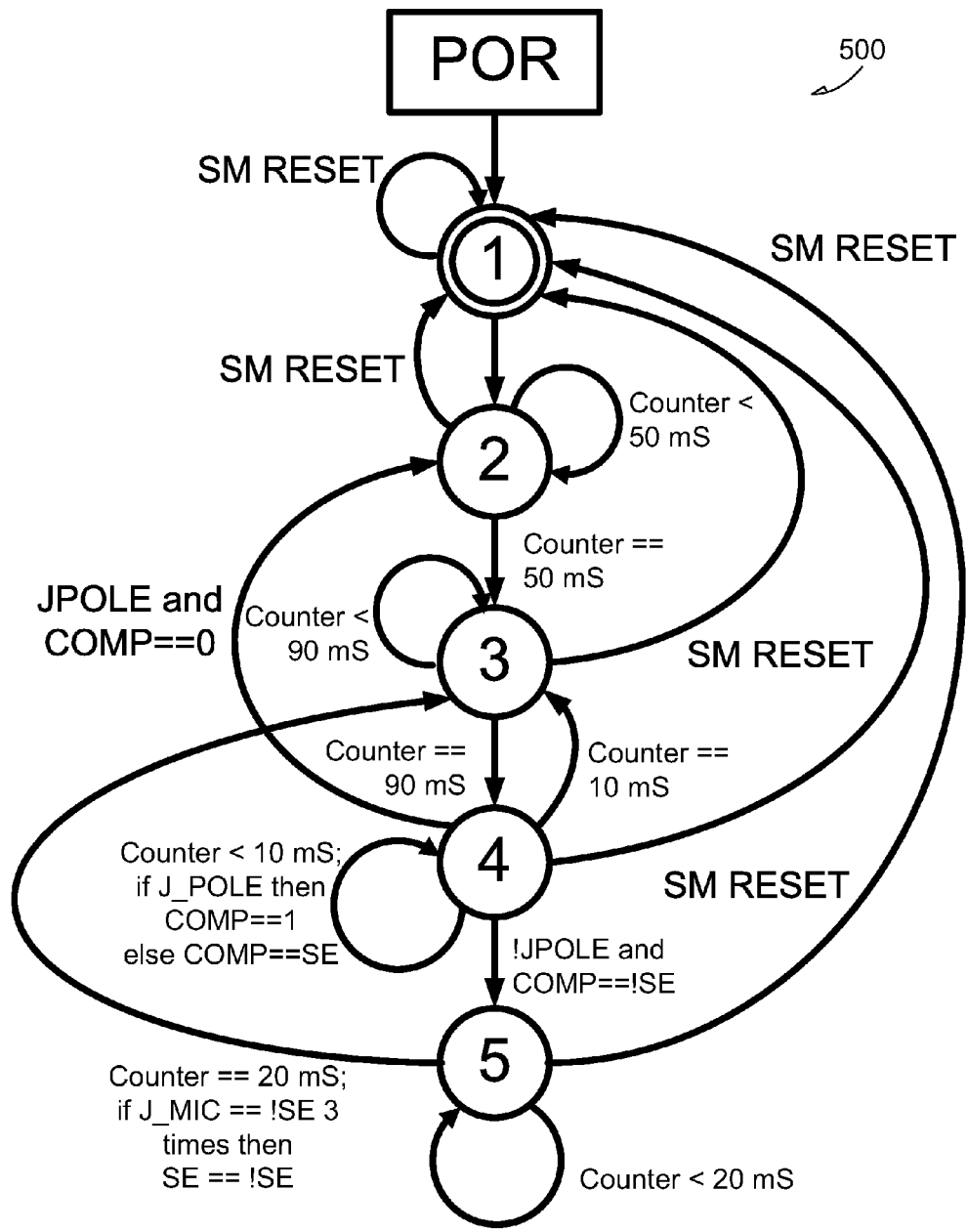

FIG. 5 illustrates generally an example of a first portion of a headset microphone pin (J_MIC) state diagram 500. In an example, the value of the comparator can be high when the headset microphone pin (J_MIC) is at or near ground, and low when the headset microphone pin (J_MIC) is above ground (e.g., 0.2 V, etc.). Generally, States 3 and 4 toggle the switch on and off at a predetermined duty cycle (e.g., shown here at a 10% duty cycle (90 mS "off", 10 mS "on"), but in other examples, one or more other duty cycles).

In State 1, a state machine reset can be asserted, a debounce process can be initialized (INIT_DB), and the internal switch can be opened. At any state in the state diagram 500, a state machine reset can bring the state machine back to State 1.

In State 2, a counter can be started, the internal switch can be closed, and the audio jack type can be determined. The state machine can remain in State 2 until the counter reaches a first time (e.g., 50 mS), and a three-pole audio jack can be determined (e.g., J_POLE=high). When the counter reaches the first time, the state machine can proceed to State 3.

In State 3, the counter can continue and the internal switch can be opened. The state machine can remain in State 3 for until the counter reaches a second time (e.g., 90 mS). When the counter reaches the second time, the state machine can proceed to State 4.

In State 4, the internal switch can be closed and the counter can be restarted. If the audio jack determination pin (J_POLE) indicates that the audio jack is a three-pole audio jack, the output of the comparator indicates that the headset microphone pin (J_MIC) is grounded (e.g., the output of the comparator is high), and until the counter reaches a third time (e.g., 10 mS), the state machine can remain in State 4. If the audio jack determination pin (J_POLE) indicates that the audio jack is a three-pole audio jack, but the output of the comparator indicates that the headset microphone pin (J_MIC) is not grounded (e.g., the output of the comparator is low), the state machine can return to State 2. If the audio jack determination pin (J_POLE) indicates that the audio jack is a four-pole audio jack, the state machine can proceed to State 5. If, in State 4, the counter reaches 10 mS, the state machine can return to State 3.

In State 5, the internal switch can remain closed, and the audio jack determination pin (J_POLE) can indicate that the audio jack is a four-pole audio jack. In State 5, the value of the headset microphone pin (J_MIC) can be sampled. If the value is different than the previous valid value (e.g., one or more times, 3 times, etc.), the valid value can be updated and the state machine can return to State 3.

Figure 6:
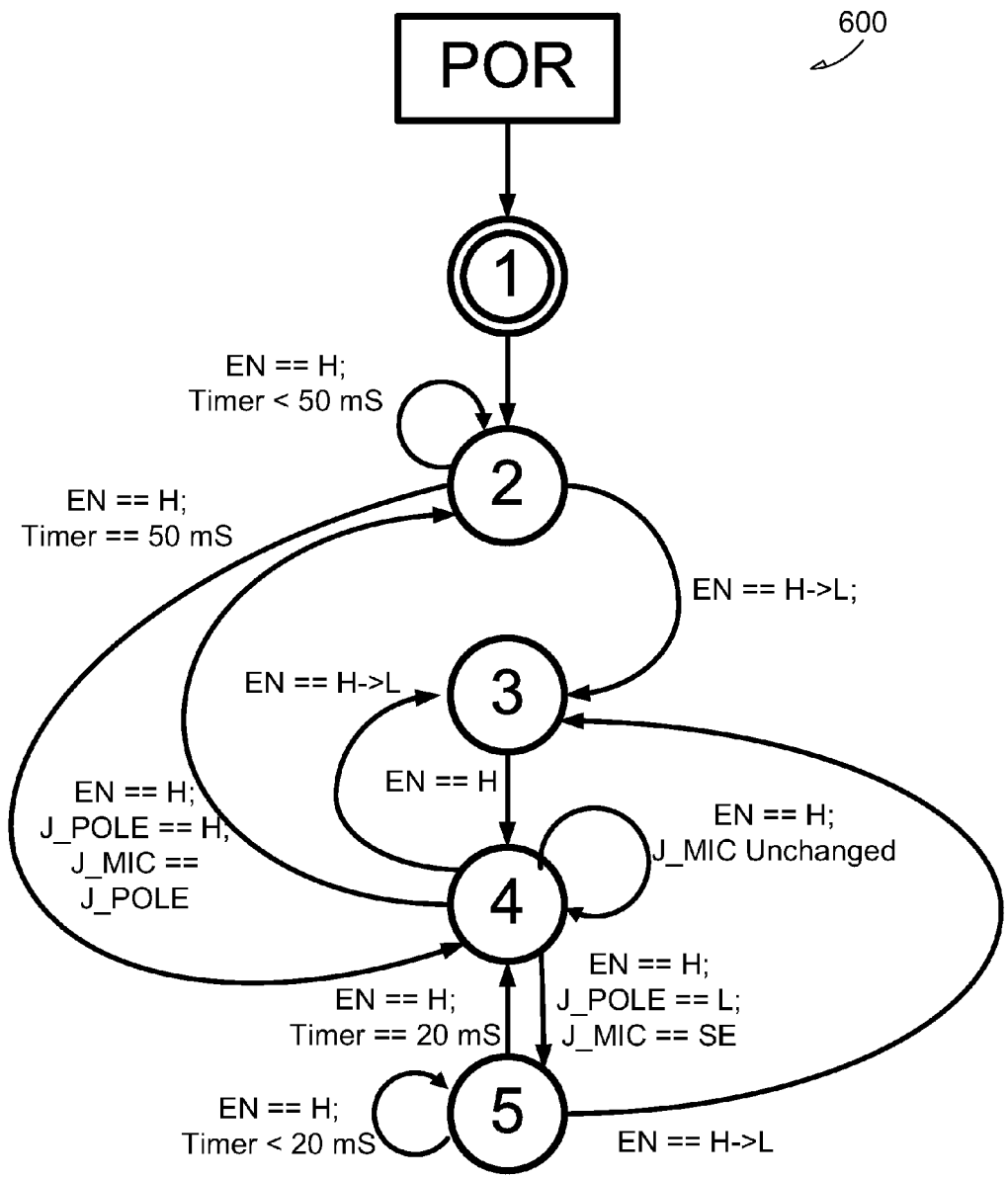

FIG. 6 illustrates generally an example of a second portion of a headset microphone pin (J_MIC) state diagram 600 with respect to an enable signal configured to control an internal switch between the headset microphone pin and a microphone connection (MIC). FIG. 6 illustrates generally an example similar to that in FIG. 5, additionally taking into account an enable signal. Generally, if the enable signal is low, the state machine can remain idle, sitting in State 3. If the enable signal is high, the state machine can proceed to determining between a three and four-pole device.

In State 1, a state machine reset can be asserted, a debounce process can be initialized (INIT_DB), and the internal switch can be opened.

In State 2, a timer can be started, the internal switch can be closed, and the audio jack type can be determined. The state machine can remain in State 2 while an enable signal is high until the counter reaches a first time (e.g., 50 mS), and a three-pole audio jack can be determined (e.g., J_POLE=high). When the counter reaches the first time and the enable signal is high, the state machine can proceed to State 4. If at any time in State 2 the enable signal transitions from high to low, the state machine can proceed to State 3.

In State 3, the state machine waits until the enable signal is high before proceeding to State 4. If the enable signal transitions from high to low in States 2, 4, or 5, the state machine proceeds to State 3.

In State 4, while the enable signal remains high, and the headset microphone pin (J_MIC) remains unchanged, the state machine remains in State 4. If the audio jack determination pin (J_POLE) indicates that the audio jack is a three-pole audio jack (e.g., J_POLE=high) and the headset microphone pin (J_MIC) changes, the state machine can return to State 2. If the audio jack determination pin (J_POLE) indicates that the audio jack is a four-pole audio jack (e.g., J_POLE=low) and the headset microphone pin (J_MIC) changes, the state machine can proceed to State 5.

In State 5, the state machine waits for an amount of time (e.g., 20 mS) before returning to State 4.

Figure 7:
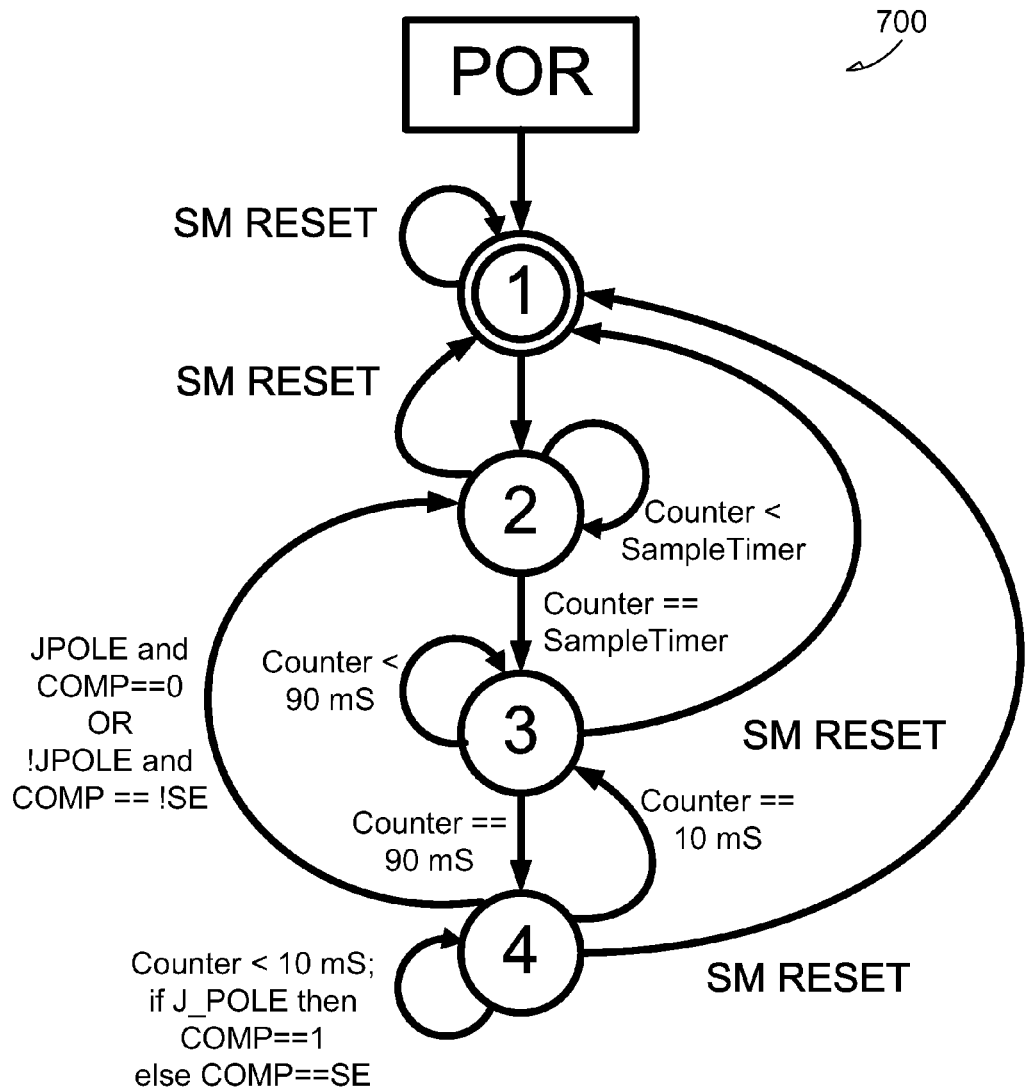
Figure 8:
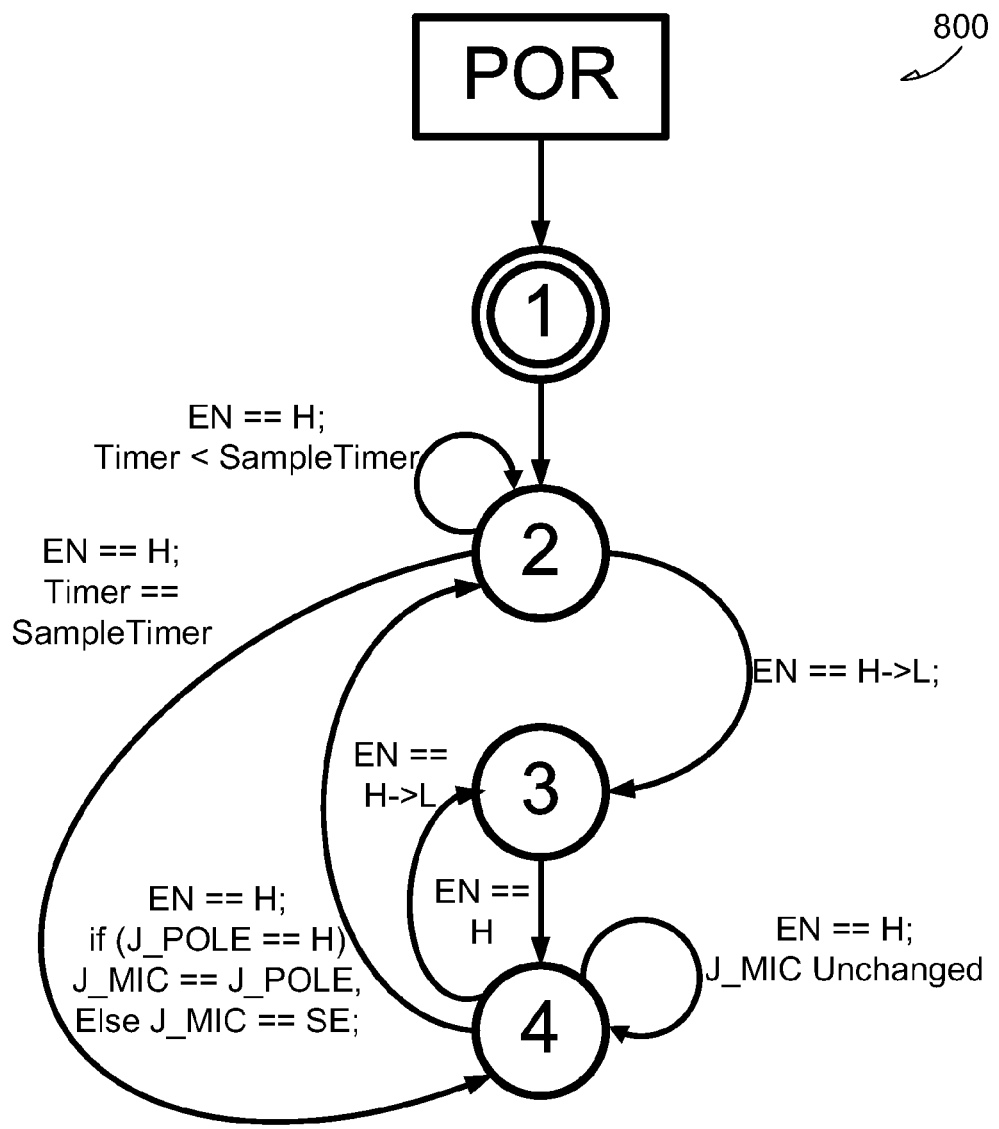

FIGS. 7-8 illustrate generally examples of first and second portions of a headset microphone pin (J_MIC) state diagrams 700, 800. FIG. 7 illustrates generally a first portion, similar in function to that illustrated in the example of FIG. 5. FIG. 8 illustrates generally a second portion with respect to an enable signal, similar in function to that illustrated in the example of FIG. 6.

In an example, a single, simplified state machine can be used to detect a three-pole or a four-pole audio jack or a send/end key activation on a four-pole audio jack. In an example, the simplified design can provide a reduced area in a die (e.g., 3600 um$^2$, etc.), a lower cost, a reduced risk in design (e.g., less code/logic, chance of error, etc.), etc.

Output Pin State Change

In an example, an output pin (e.g., DET) can only change state when the opposite state has been sampled a predetermined number of times (e.g., 3 times) in a sampling period, for example, to ensure correct transitions between states. In an example, samples can be made at three portions of a sample period (e.g., 60% of the period, 80%, 100%, etc.). In this example, each of the three samples must be the opposite of the output pin in order to change the value of the output pin.

Program Count Value in Metal

In many applications, changes to a base count value are accomplished with changes to discrete circuits or software, which can be expensive and time consuming. In an example, the logic of the audio jack detection circuit can have a base count value (e.g., 10 ms) that can be adjusted in metal. In certain examples, each adjustment can be an increment of the base count value. Depending on customer requirements, the base count value can be adjusted, effectively adjusting the time periods throughout the device.

In an example, the base count value can be defined using tie cells to either VDD or GND as desired, which can be changed in metal without changing the remaining counter logic. The counter logic can count until it reaches this metal programmable number. Each overflow increments a separate counter to allow for all counters to be proportional to each other at all times, allowing for fast and cheap variants of a core product by reducing or increasing debounce counters for various customer needs.

Additional Notes and Examples

In Example 1, an apparatus includes an audio jack detection circuit configured to be coupled to an audio jack receptacle, the audio jack detection circuit including an oscillator and digital logic configured to receive a clock signal from the oscillator and to determine a type of audio jack in the audio jack receptacle, wherein the audio jack detection circuit is configured to receive audio jack receptacle information, to disable the oscillator when the audio jack receptacle information indicates that the audio jack receptacle is empty, and to enable the oscillator when the audio jack receptacle information indicates that the audio jack receptacle includes an audio jack.

In Example 2, the audio jack detection circuit of Example 1 optionally includes a buffer having an input configured to be coupled to the audio jack receptacle and a current source coupled to the buffer, the current source configured to provide a voltage at the input of the buffer when the audio jack receptacle is empty, wherein, when the audio jack receptacle includes the audio jack, the voltage at the buffer is reduced.

In Example 3, the current source of any one or more of Examples 1-2 is optionally equal to or less than one microamp (μA) to reduce power usage when the audio jack receptacle is empty.

In Example 4, the audio jack detection circuit of any one or more of Examples 1-3 optionally includes a buffer having an input configured to be coupled to the audio jack receptacle and a current sink coupled to the buffer, the current sink configured to provide a voltage at the input of the buffer when the audio jack receptacle includes the audio jack, wherein, when the audio jack receptacle is empty, the voltage at the buffer is reduced.

In Example 5, the digital logic of any one or more of Examples 1-4 is optionally configured to determine the type of audio jack in the audio jack receptacle as a three-pole audio jack or a four-pole audio jack, wherein the audio jack detection circuit is configured to provide information about the determined type of audio jack to a processor.

In Example 6, the type of audio jack of any one or more of Examples 1-5 optionally includes at least one of a three-pole audio jack or a four-pole audio jack, wherein the three-pole audio jack of any one or more of Examples 1-5 optionally includes a left audio connection, a right audio connection, and ground, and wherein the four-pole audio jack of any one or more of Examples 1-5 optionally includes a left audio connection, a right audio connection, ground, and a microphone connection.

In Example 7, the audio jack detection circuit of any one or more of Examples 1-6 optionally includes a comparator having a first input configured to be coupled to a microphone connection of the audio jack receptacle and to a microphone bias, wherein the comparator is configured to determine if the microphone connection of the audio jack receptacle is grounded using the microphone connection of the audio jack receptacle and the microphone bias, wherein the digital logic is configured to determine the type of audio jack in the audio jack receptacle using the comparator.

In Example 8, if the determined type of audio jack is a four-pole audio jack, the digital logic of any one or more of Examples 1-7 is optionally configured to detect a send/end key state change using the comparator.

In Example 9, any one or more of Examples 1-10 optionally includes a switch configured to selectively couple the first input of the comparator to the microphone bias when the audio jack receptacle information indicates that the audio jack receptacle includes an audio jack.

In Example 10, when the audio jack receptacle information indicates that the audio jack receptacle includes an audio jack, the switch of any one or more of Examples 1-9 is optionally configured to couple and decouple the microphone bias from the microphone connection of the audio jack receptacle at a specified duty cycle to reduce leakage current through the audio jack.

In Example 11, the audio jack detection circuit of any one or more of Examples 1-10 optionally includes a comparator and a switch coupled to the comparator, wherein the comparator of any one or more of Examples 1-10 optionally includes a first input configured to be coupled to a microphone connection of the audio jack receptacle and to the switch, wherein the switch is controlled by the digital logic and is configured to selectively couple the first input of the comparator to a microphone bias when the audio jack receptacle information indicates that the audio jack receptacle includes an audio jack, wherein the comparator is configured to determine if the microphone connection of the audio jack receptacle is grounded using the microphone bias and the microphone connection of the audio jack receptacle, and wherein the digital logic is configured to determine the type of audio jack in the audio jack receptacle using the comparator.

In Example 12, if the determined type of audio jack is a four-pole audio jack, the digital logic of any one or more of Examples 1-11 is optionally configured to detect a send/end key state change using the comparator.

In Example 13, the digital logic of any one or more of Examples 1-12 optionally includes a register configured to store the detected send/end key state change, and wherein the digital logic is configured to validate the detected send/end key state change using more than one successive, consistent stored output from the comparator.

In Example 14, if the determined type of audio jack is a three-pole audio jack, the digital logic of any one or more of Examples 1-13 is optionally configured to periodically redetermine the type of audio jack using the comparator.

In Example 15, if the determined type of audio jack is a four-pole audio jack, the digital logic of any one or more of Examples 1-14 is optionally configured to not redetermine the type of audio jack until the audio jack detection circuit is reset of until the audio jack receptacle information indicates that the audio jack has been removed from the audio jack receptacle.

In Example 16, a method includes receiving audio jack receptacle information at an audio jack detection circuit, disabling an oscillator when the audio jack receptacle information indicates that the audio jack receptacle is empty, and enabling the oscillator and determining a type of audio jack in the audio jack receptacle, using digital logic configured to receive a clock signal from the oscillator, when the audio jack receptacle information indicates that the audio jack receptacle includes an audio jack.

In Example 17, the receiving the audio jack receptacle information of any one or more of Examples 1-16 optionally includes receiving a first voltage at an input to a buffer from a current source when the audio jack receptacle is empty and receiving a second voltage at the input to the buffer from the current source when the audio jack receptacle includes an audio jack.

In Example 18, the receiving the audio jack receptacle information of any one or more of Examples 1-17 optionally includes receiving a first voltage at an input to a buffer from a current source when the audio jack receptacle is empty and receiving a second, lower voltage at the input to the buffer when the audio jack receptacle includes an audio jack.

In Example 19, the receiving the audio jack receptacle information of any one or more of Examples 1-18 optionally includes receiving a first voltage at an input to a buffer from when the audio jack receptacle is empty and receiving a second, higher voltage at the input to the buffer when the audio jack receptacle includes an audio jack.

In Example 20, the determining the type of audio jack in the audio jack receptacle of any one or more of Examples 1-19 optionally includes determining the type of audio jack as a three-pole audio jack or a four-pole audio jack and providing information about the determined type of audio jack to a processor, wherein the three-pole audio jack of any one or more of Examples 1-19 optionally includes a left audio connection, a right audio connection, and ground, wherein the four-pole audio jack of any one or more of Examples 1-19 optionally includes a left audio connection, a right audio connection, ground, and a microphone connection.

In Example 21, any one or more of Examples 1-20 optionally includes determining if a microphone connection of the audio jack receptacle is grounded using a comparator and a microphone bias, wherein the determining the type of audio jack in the audio jack receptacle of any one or more of Examples 1-20 optionally includes using the comparator.

In Example 22, any one or more of Examples 1-21 optionally includes detecting a send/end key state change using the comparator if the determined type of audio jack is a four-pole audio jack.

In Example 23, any one or more of Examples 1-22 optionally includes selectively coupling the comparator to the microphone bias when the audio jack receptacle information indicates that the audio jack receptacle includes an audio jack.

In Example 24, the selectively coupling the comparator to the microphone bias of any one or more of Examples 1-23 optionally includes at a specified duty cycle to reduce leakage current through the audio jack.

In Example 25, any one or more of Examples 1-24 optionally includes storing the detected send/end key state change in a register and validating the detected send/end key state change using more than one successive, consistent stored state change.

In Example 26, any one or more of Examples 1-19 optionally includes periodically redetermining the type of audio jack using the comparator if the determined type of audio jack is a three-pole audio jack.

In Example 27, any one or more of Examples 1-26 optionally includes not periodically redetermining the type of audio jack, if the determined type of audio jack is a four-pole audio jack, until the audio jack detection circuit is reset or until the audio jack receptacle information indicates that the audio jack as been removed from the audio jack receptacle.

In Example 28, a system includes a processor, an audio jack detection circuit coupled to the processor and an audio jack receptacle coupled to the audio jack detection circuit, the audio jack receptacle configured to receive an audio jack from an external device wherein the audio jack detection circuit optionally includes an oscillator and digital logic configured to receive a clock signal from the oscillator and to determine a type of audio jack in the audio jack receptacle, wherein the audio jack detection circuit is configured to receive audio jack receptacle information, to disable the oscillator when the audio jack receptacle information indicates that the audio jack receptacle is empty, and to enable the oscillator when the audio jack receptacle information indicates that the audio jack receptacle includes an audio jack.

In Example 29, any one or more of Examples 1-28 optionally includes a cellular phone, the cellular phone including the processor, wherein the processor include a baseband processor, the audio jack detection circuit, and the audio jack receptacle.

In Example 30, a system or apparatus can include, or can optionally be combined with any portion or combination of any portions of any one or more of Examples 1-29 to include, means for performing any one or more of the functions of Examples 1-29 or a machine-readable medium including instructions that, when performed by a machine, cause the machine to perform any one or more of the functions of Examples 1-29.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
    an audio jack detection circuit configured to be coupled to an audio jack receptacle, the audio jack detection circuit including:
        an oscillator;
        a comparator having a first input configured to be coupled to a microphone connection of the audio jack receptacle and to a microphone bias, wherein the comparator is configured to determine if the microphone connection of the audio jack receptacle is grounded using the microphone connection of the audio jack receptacle and the microphone bias; and
        digital logic configured to receive a clock signal from the oscillator and to determine a type of audio jack in the audio jack receptacle using the comparator; and
    wherein the audio jack detection circuit is configured to receive audio jack receptacle information, to disable the oscillator when the audio jack receptacle information indicates that the audio jack receptacle is empty, and to enable the oscillator when the audio jack receptacle information indicates that the audio jack receptacle includes an audio jack.

2. The apparatus of claim 1, wherein the audio jack detection circuit includes:
    a buffer having an input configured to be coupled to the audio jack receptacle;
    a current source coupled to the buffer, the current source configured to provide a voltage at the input of the buffer when the audio jack receptacle is empty; and
    wherein, when the audio jack receptacle includes the audio jack, the voltage at the buffer is reduced.

3. The apparatus of claim 2, wherein the current source is equal to or less than one microamp ($\mu A$) to reduce power usage when the audio jack receptacle is empty.

4. The apparatus of claim 1, wherein the audio jack detection circuit includes:
    a buffer having an input configured to be coupled to the audio jack receptacle;
    a current sink coupled to the buffer, the current sink configured to provide a voltage at the input of the buffer when the audio jack receptacle includes the audio jack;
    wherein, when the audio jack receptacle is empty, the voltage at the buffer is reduced.

5. The apparatus of claim 1, wherein the digital logic is configured to determine the type of audio jack in the audio jack receptacle as a three-pole audio jack or a four-pole audio jack; and
    wherein the audio jack detection circuit is configured to provide information about the determined type of audio jack to a processor.

6. The apparatus of claim 1, wherein the type of audio jack includes at least one of a three-pole audio jack or a four-pole audio jack;
    wherein the three-pole audio jack includes a left audio connection, a right audio connection, and ground; and
    wherein the four-pole audio jack includes a left audio connection, a right audio connection, ground, and a microphone connection.

7. The apparatus of claim 1, wherein, if the determined type of audio jack is a four-pole audio jack, the digital logic is configured to detect a send/end key state change using the comparator.

8. The apparatus of claim 7, including a switch configured to selectively couple the first input of the comparator to the microphone bias when the audio jack receptacle information indicates that the audio jack receptacle includes an audio jack.

9. The apparatus of claim 8, wherein, when the audio jack receptacle information indicates that the audio jack receptacle includes an audio jack, the switch is configured to couple and decouple the microphone bias from the microphone connection of the audio jack receptacle at a specified duty cycle to reduce leakage current through the audio jack.

10. The apparatus of claim 1, wherein the audio jack detection circuit includes:
a comparator; and
a switch coupled to the comparator;
wherein the comparator includes a first input configured to be coupled to a microphone connection of the audio jack receptacle and to the switch;
wherein the switch is controlled by the digital logic and is configured to selectively couple the first input of the comparator to a microphone bias when the audio jack receptacle information indicates that the audio jack receptacle includes an audio jack;
wherein the comparator is configured to determine if the microphone connection of the audio jack receptacle is grounded using the microphone bias and the microphone connection of the audio jack receptacle; and
wherein the digital logic is configured to determine the type of audio jack in the audio jack receptacle using the comparator.

11. The apparatus of claim 10, wherein, if the determined type of audio jack is a four-pole audio jack, the digital logic is configured to detect a send/end key state change using the comparator.

12. The apparatus of claim 11, wherein the digital logic includes a register configured to store the detected send/end key state change, and wherein the digital logic is configured to validate the detected send/end key state change using more than one successive, consistent stored output from the comparator.

13. The apparatus of claim 10, wherein, if the determined type of audio jack is a three-pole audio jack, the digital logic is configured to periodically redetermine the type of audio jack using the comparator.

14. The apparatus of claim 10, wherein, if the determined type of audio jack is a four-pole audio jack, the digital logic is configured to not redetermine the type of audio jack until the audio jack detection circuit is reset of until the audio jack receptacle information indicates that the audio jack has been removed from the audio jack receptacle.

15. A method comprising:
receiving audio jack receptacle information at an audio jack detection circuit;
determining if a microphone connection of the audio jack receptacle is grounded using a comparator and a microphone bias;
disabling an oscillator when the audio jack receptacle information indicates that the audio jack receptacle is empty; and
enabling the oscillator and determining a type of audio jack in the audio jack receptacle, using digital logic configured to receive a clock signal from the oscillator, when the audio jack receptacle information indicates that the audio jack receptacle includes an audio jack, wherein the determining the type of audio jack in the audio jack receptacle includes using the comparator.

16. The method of claim 15, wherein the receiving the audio jack receptacle information includes:
receiving a first voltage at an input to a buffer from a current source when the audio jack receptacle is empty; and
receiving a second voltage at the input to the buffer from the current source when the audio jack receptacle includes an audio jack.

17. The method of claim 15, wherein the receiving the audio jack receptacle information includes:
receiving a first voltage at an input to a buffer from a current source when the audio jack receptacle is empty; and
receiving a second, lower voltage at the input to the buffer when the audio jack receptacle includes an audio jack.

18. The method of claim 15, wherein the receiving the audio jack receptacle information includes:
receiving a first voltage at an input to a buffer from when the audio jack receptacle is empty; and
receiving a second, higher voltage at the input to the buffer when the audio jack receptacle includes an audio jack.

19. The method of claim 15, wherein the determining the type of audio jack in the audio jack receptacle includes determining the type of audio jack as a three-pole audio jack or a four-pole audio jack;
wherein the three-pole audio jack includes a left audio connection, a right audio connection, and ground;
wherein the four-pole audio jack includes a left audio connection, a right audio connection, ground, and a microphone connection; and
providing information about the determined type of audio jack to a processor.

20. The method of claim 15, including detecting a send/end key state change using the comparator if the determined type of audio jack is a four-pole audio jack.

21. The method of claim 20, including selectively coupling the comparator to the microphone bias when the audio jack receptacle information indicates that the audio jack receptacle includes an audio jack.

22. The method of claim 21, wherein the selectively coupling the comparator to the microphone bias includes at a specified duty cycle to reduce leakage current through the audio jack.

23. The method of claim 20, including storing the detected send/end key state change in a register and validating the detected send/end key state change using more than one successive, consistent stored state change.

24. The method of claim 20, including periodically redetermining the type of audio jack using the comparator if the determined type of audio jack is a three-pole audio jack.

25. The method of claim 20, including not periodically redetermining the type of audio jack, if the determined type of audio jack is a four-pole audio jack, until the audio jack detection circuit is reset or until the audio jack receptacle information indicates that the audio jack as been removed from the audio jack receptacle.

26. A system comprising:
a processor,
an audio jack detection circuit coupled to the processor,
an audio jack receptacle coupled to the audio jack detection circuit, the audio jack receptacle configured to receive an audio jack from an external device; and
wherein the audio jack detection circuit includes:
an oscillator;
a comparator having a first input configured to be coupled to a microphone connection of the audio jack receptacle and to a microphone bias, wherein the comparator is configured to determine if the microphone connection of the audio jack receptacle is grounded using the microphone connection of the audio jack receptacle and the microphone bias; and digital logic configured to receive a clock signal from the oscillator and to determine a type of audio jack in the audio jack receptacle using the comparator; and wherein the audio jack detection circuit is configured to receive audio jack receptacle information, to disable the oscillator when the audio jack receptacle information indicates that the audio jack receptacle is empty, and to enable the oscillator when the audio jack receptacle information indicates that the audio jack receptacle includes an audio jack.

27. The system of claim 26, including a cellular phone, the cellular phone including:

the processor, wherein the processor include a baseband processor;

the audio jack detection circuit; and the audio jack receptacle.

\* \* \* \* \*